United States Patent
Hernon

(10) Patent No.: US 7,961,462 B2
(45) Date of Patent: Jun. 14, 2011

(54) USE OF VORTEX GENERATORS TO IMPROVE EFFICACY OF HEAT SINKS USED TO COOL ELECTRICAL AND ELECTRO-OPTICAL COMPONENTS

(75) Inventor: Domhnaill Hernon, Bettystown (IE)

(73) Assignee: Alcatel Lucent, Paris (FR)

( * ) Notice: Subject to any disclaimer, the term of this patent is extended or adjusted under 35 U.S.C. 154(b) by 82 days.

(21) Appl. No.: 12/473,657

(22) Filed: May 28, 2009

(65) Prior Publication Data
US 2010/0302730 A1    Dec. 2, 2010

(51) Int. Cl.
*H05K 7/20* (2006.01)
*H01L 23/473* (2006.01)

(52) U.S. Cl. ............ 361/694; 361/679.47; 361/679.51; 361/696; 361/697; 165/80.3; 165/109.1; 165/121; 165/122

(58) Field of Classification Search ............ 361/679.46, 361/679.47, 679.48, 679.5, 679.51, 679.54, 361/690–697, 704–712, 715, 719, 720; 257/706–727; 174/15.1, 16.3, 252; 165/80.3, 165/104.33, 185, 121, 109.1, 151; 454/184
See application file for complete search history.

(56) References Cited

U.S. PATENT DOCUMENTS

| | | | | |
|---|---|---|---|---|
| 4,984,627 A * | 1/1991 | LeBourgeois | ............... | 165/11.2 |
| 5,058,837 A * | 10/1991 | Wheeler | .................... | 244/200.1 |
| 5,077,601 A * | 12/1991 | Hatada et al. | ................. | 257/722 |
| 5,121,290 A * | 6/1992 | Azar | .............................. | 361/692 |
| 5,361,828 A * | 11/1994 | Lee et al. | .................... | 165/109.1 |
| 5,422,787 A * | 6/1995 | Gourdine | ....................... | 361/697 |
| 5,671,198 A * | 9/1997 | Tsuchiya et al. | ........... | 369/30.32 |
| 5,703,374 A * | 12/1997 | Caprari | ..................... | 250/492.2 |
| 5,763,950 A * | 6/1998 | Fujisaki et al. | ............... | 257/712 |
| 5,915,463 A * | 6/1999 | Romero et al. | .............. | 165/80.3 |
| 6,578,627 B1 * | 6/2003 | Liu et al. | .................... | 165/109.1 |
| 6,735,082 B2 * | 5/2004 | Self | ................ | 361/703 |
| 7,096,678 B2 * | 8/2006 | Petroski | .......................... | 62/3.2 |
| 7,385,821 B1 * | 6/2008 | Feierbach | ..................... | 361/705 |
| 7,474,528 B1 * | 1/2009 | Olesiewicz et al. | ........... | 361/695 |
| 2005/0006063 A1 * | 1/2005 | Zhang | ........................ | 165/109.1 |
| 2008/0062644 A1 * | 3/2008 | Petroski | ........................ | 361/695 |
| 2009/0321046 A1 * | 12/2009 | Hernon et al. | ............... | 165/80.3 |

FOREIGN PATENT DOCUMENTS
JP    02008091700 A    *    4/2008

OTHER PUBLICATIONS

K. Torii, K.M. Kwak, and K. Nishino, "Heat Transfer Enhancement Accompanying Pressure-loss reduction with Winglet-type vortex Generators for Fin-tube Heat Exchangers," Int. J. Heat and Mass Transfer, vol. 45, pp. 3795-3801, 2002.

A.M. Jacobi and R.K. Shah. "Heat Transfer Surface Enhancement Through the Use of Longitudinal Vortices: A Review of Recent Progress," Exp. Thermal and Fluid Science, vol. 11, pp. 295-309, 1995.

(Continued)

*Primary Examiner* — Michael V Datskovskiy
(74) *Attorney, Agent, or Firm* — Wall & Tong, LLP

(57) ABSTRACT

Use of vortex generators to improve efficacy of heat sinks used to cool telecommunications, electrical and electro-optical components.

15 Claims, 6 Drawing Sheets

OTHER PUBLICATIONS

A. Joardar and A.M. Jacobi, "Impact of Leading Edge Delta-wing Vortex Generators on the Thermal Performance of a Flat Tube, Louvered-fin Compact Heat Exchanger," Int. J. Heat and Mass Transfer, vol. 48, pp. 1480-1493, 2005.

P. Deb, G. Biswas and N.K. Mitra, "Heat Transfer and Flow Structure in Laminar and Turbulent Flows in a Rectangular Channel with Longitudinal Vortices," Int. J. of Heat and Mass Transfer, 38, pp. 2427-2444, 1995.

K. Torii, J.I. Yanagihara, and Y. Nagai, "Heat Transfer Enhancement by Vortex Generators," Proc. ASME/JSME Thermal Eng. Joint Conf., pp. 77-83, 1991.

M.C. Jentry and A.M. Jacobi, "Heat Transfer Enhancement by Delta-wing-Generated Tip Vortices in Flat Plate and Developing Channel Flows," J. Heat Transfer, vol. 124, pp. 1158-1168, 2002.

A. Joardar and A.M. Jacobi, "Heat Transfer Enhancement by Winglet-type Vortex Generator Arrays in Compact Plain-Fin-and-Tube Heat Exchangers," Int. J. Refrigeration, doi:10.106/j.irefrig.2007.04.0111, 2007.

S.R. Hiravennavar, E.G. Tulapurkara, and G. Biswas, "A Note on the Flow and Heat Transfer Enhancement in a Channel with Built-in Winglet Pair," Int. J. Heat and Fluid Flow, vol. 28, pp. 299-305, 2007.

J.I. Yanagihara and K. Tori, "Heat Transfer Augmentation by Longitudinal Vortices Rows," Proc. $3^{rd}$ world Conf. on Experiment Heat Transfer, Fluid Mechanics, and Thermodynamics, pp. 560-567, 1991.

E. Kim, and J.S. Yang, "An Experimental Study of Heat Transfer Characteristics of a Pair of Longitudinal Vortices Using Color Capturing Technique," Int. J. Heat and Mass Transfer, vol. 45, pp. 3349-3356, 2002.

S. Ferrouillat, P. Tochon, C. Garnier and H. Peerhossaini, "Intensification of Heat-Transfer and Mixing in Multifunctional Heat Exchangers by Artificially Generated Streamwise Vorticity," Applied Thermal Engineering, vol. 26, pp. 1820-1829, 2006.

A. Sohankar, "Heat Transfer Augmentation in a Rectangular Channel with a Vee-shaped Vortex Generator," Int. J. Heat and Fluid Flow, vol. 28, pp. 306-317 2007.

* cited by examiner

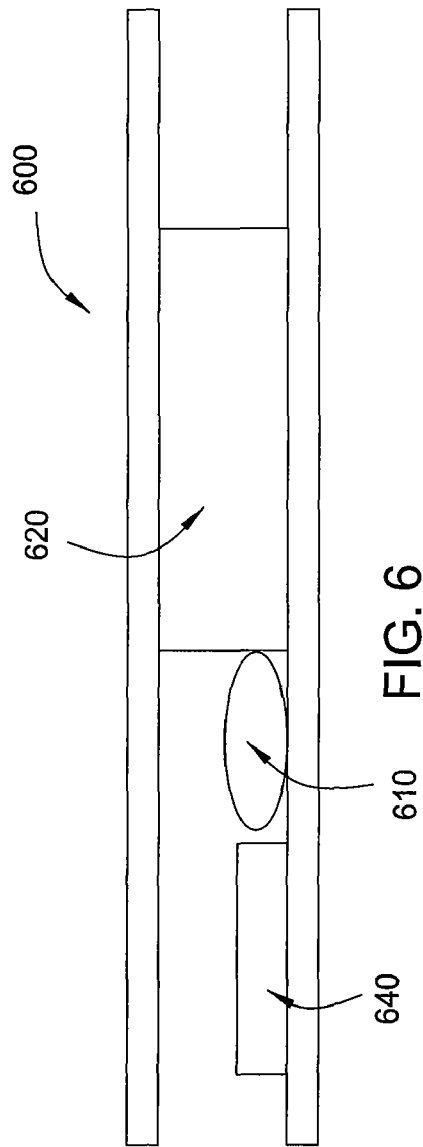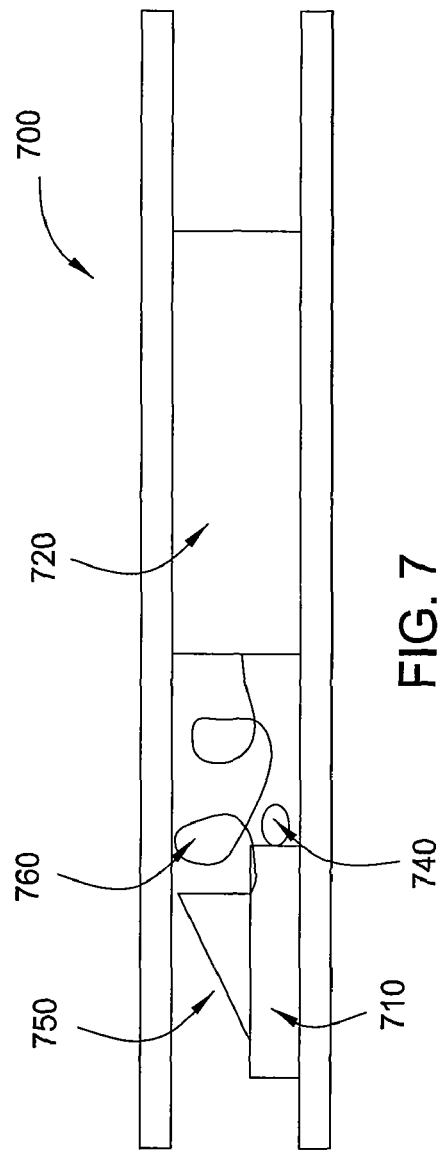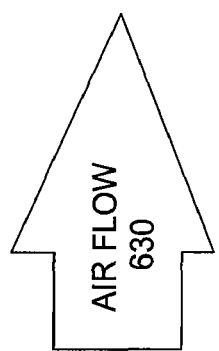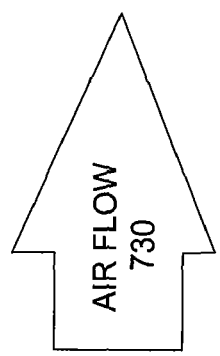

USE OF VORTEX GENERATORS TO IMPROVE EFFICACY OF HEAT SINKS USED TO COOL ELECTRICAL AND ELECTRO-OPTICAL COMPONENTS

FIELD OF THE INVENTION

The invention relates to circuit pack cooling and, more particularly but not exclusively, to a heat dissipation mechanism for components such as telecommunications network components.

BACKGROUND

The standard cooling solution for telecommunications equipment (and other heat generating equipment) is to thermally connect metal (e.g., aluminum) heat sinks to heat generating components and to force air through these heat sinks via fans. However, next generation electrical, optical and/or electro-optical products have significantly increased power dissipation due to enhanced functionality, power density and so on.

Increased power density of components requires increased cooling levels, such as provided by improved heat sinks or higher fan airflow.

One improvement in heat sink design is the use of copper instead of aluminum. Copper has twice the thermal conductivity of aluminum, but is much more expensive. Moreover, even pure copper heat sinks do not supply adequate cooling for some equipment, such as remote network controller boards. Copper heat sinks may be augmented by using heat pipes to spread the heat evenly on the base of the heat sink.

Increasing fan-derived airflow in not a comprehensive solution. Fans are a significant source of audible noise, and the operation of fans at higher power or airflow is constrained by allowable noise levels (typically 65 Dba in a central office environment). In addition, fans are relatively unreliable in comparison to other types of components, especially when operated at maximum power and/or at high temperatures.

In the case of optical transport circuit packs, the best solution heretofore recognized was to place individual parallel fin heat sinks on each of the optical transceivers (such as small form-factor pluggable transceivers, SFPs and/or XFPs). Due to the size of the optical transceivers, there is little available space for extra height on the optical transceiver heat sink fins, such that shorter (less effective) optical transceiver heat sinks are typically used. Also, because each optical transceiver has its own individual heat sink, there is wasted space in between each optical transceiver where extra heat transfer surface material could be utilized.

SUMMARY

Embodiments of the present invention provide new and improved methods, apparatuses and systems that address the above-referenced difficulties and others.

In accordance with various embodiments, enhanced heat transfer in a forced air cooling system is improved by imparting a vortex or other perturbation to the airflow proximate a heat sink. That is, a normally steady airflow is made unsteady by, for example, a vortex generator disposed within the flow.

An apparatus according to one embodiment includes at least one heat sink having a plurality of cooling fins for cooling at least one heat generating component; and at least one vortex generator, positioned upstream of the at least one heat sink in relation to a cooling fluid flow presented to the at least one heat sink such that at least one vortex having an unsteady flow is imparted to the cooling fluid flow proximate the surfaces of the plurality of cooling fins of the at least one heat sink to reduce thereby the thermal resistance of the at least one heat sink.

A method according to one embodiment includes disposing at least one heat sink having a plurality of cooling fins in thermal communication with at least one heat generating component of a circuit pack; providing at least one source for a cooling fluid flow directed towards the at least one heat sink; and disposing at least one vortex generator on the circuit pack upstream of the at least one heat sink in relation to the cooling fluid flow presented to the at least one heat sink such that at least one vortex having an unsteady flow is imparted to the cooling fluid flow proximate the surfaces of the plurality of cooling fins of the at least one heat sink to reduce thereby the thermal resistance of the at least one heat sink.

Further scope of the applicability of the various embodiments will become apparent from the detailed description provided below. It should be understood, however, that the detailed description and specific examples, while indicating particular embodiments of the invention, are given by way of illustration only, since various changes and modifications within the spirit and scope of the invention will become apparent to those skilled in the art.

DESCRIPTION OF THE DRAWINGS

Embodiments of the present invention exists in the construction, arrangement, and combination of the various parts of the device/apparatus, steps of the method, and system whereby the objects contemplated are attained as hereinafter more fully set forth, specifically pointed out in the claims, and illustrated in the accompanying drawings in which:

FIG. 6 depicts a side view of a representation of an exemplary circuit pack, such as the circuit pack of FIG. 5, without vortex generators deployed; and FIG. 7 depicts a side view of a representation of an exemplary circuit pack, such as the circuit pack of FIG. 5, with vortex generators deployed in accordance with one embodiment;

To facilitate understanding, identical reference numerals have been used, where possible, to designate identical elements that are common to the figures.

DETAILED DESCRIPTION

Embodiments of the invention are generally directed to improving the cooling of next generation electrical, optical and/or electro-optical products, such as telecommunications products including remote network controllers, optical transmission devices (e.g., optical transport service packs) and the like. These products require significantly increased power dissipation due to their enhanced functionality. The features depicted and described herein provide new and improved methods and techniques to address these heat dissipation issues.

Embodiments of the present invention will be primarily described within the context of telecommunications circuit pack assemblies, for example remote network controller boards or optical transport circuit packs, such as multi-service transport switches. Those skilled in the art and informed by the teachings herein will realize that such embodiments are also applicable to any circuit pack components or other devices incorporating heat sinks. In the case of telecommunications circuit packs, the standard cooling solution is to thermally connect metal heat sinks to the heat generating components and to pass airflow over these heat sinks via one or many fans.

Figure 1:
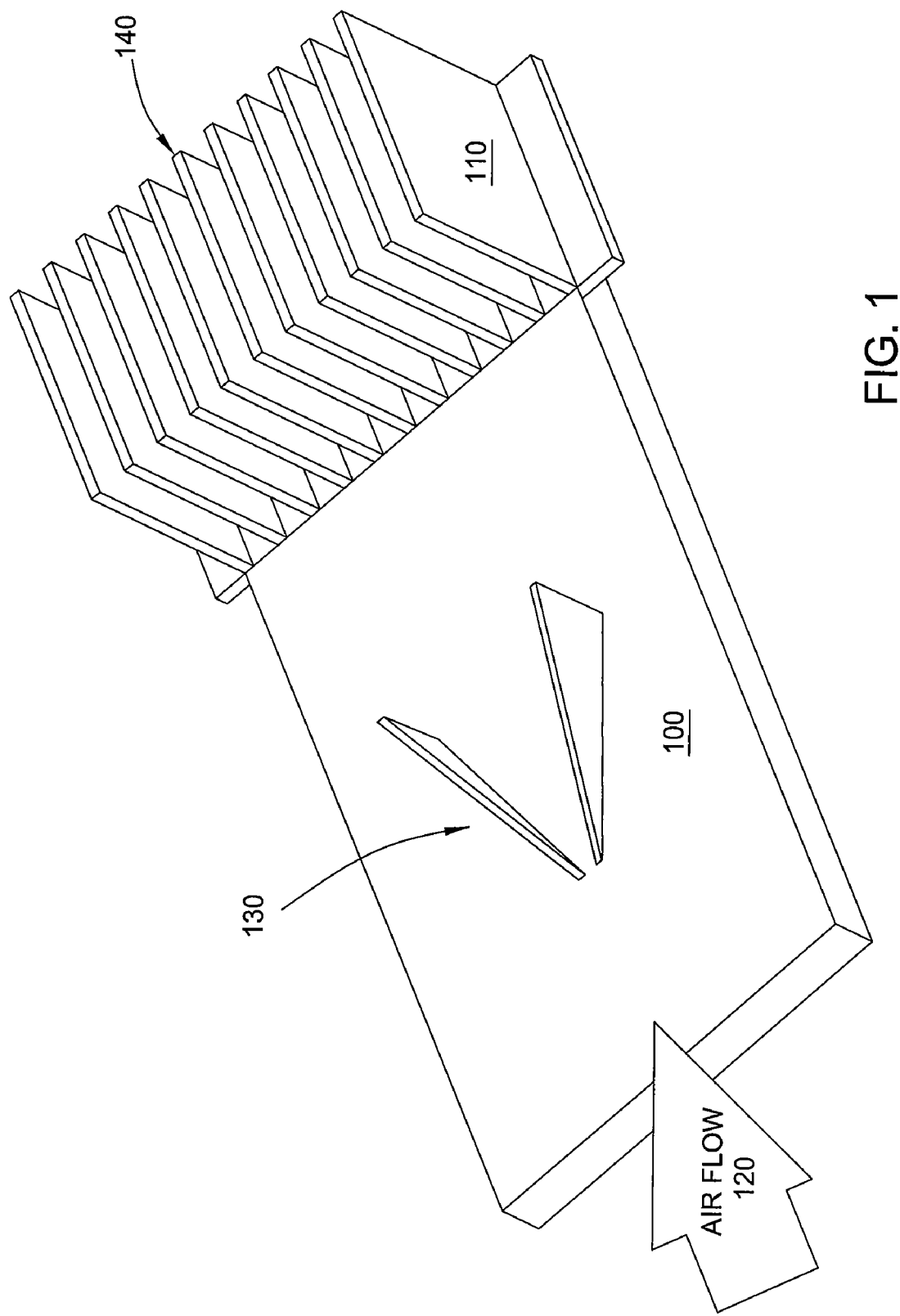
FIG. 1 depicts a perspective view of features of a model circuit pack layout in accordance with one embodiment.

FIG. 1 depicts a perspective view of features of a model circuit pack layout (100) in accordance with one embodiment. The circuit pack (100) may comprise a multi-service transport switch for example. The circuit pack (100) may include at least one or more heat generating components (not shown) having one or more heat sinks (110) attached thereto.

Depicted in FIG. 1 is a single longitudinal fin heat sink (110) situated over one or more heat generating components (not shown). The longitudinal fin heat sink (110) has a plurality of longitudinal fins (140) for enhancing heat transfer. Although only a single heat sink is depicted, it should be understood that a plurality of heat sinks may be used within the scope of the described embodiments. In addition, although a longitudinal fin heat sink (110) is depicted, it should be understood that other heat sink designs may be used in accordance with described embodiments. For example, the heat sink (110) may also comprise a pin fin design or any other suitable design.

In one embodiment, the heat sink (110) is a copper heat sink. Alternatively, the heat sink (110) may be aluminum or one or more other conductive metals. External to the circuit pack (100) is one or more cooling fluid flow sources (120). The cooling fluid flow may comprise an air flow or any other suitable type of cooling fluid flow such as gaseous helium, nitrogen or any other substantially electrically inert gas/vapor or liquid, or any combination of the same. In general the cooling fluid flow is directed by the one or more sources (120) towards heat generating components and their respective heat sinks (110), if any. The direction of airflow is indicated by the arrow in FIG. 1.

In accordance with embodiments described herein, one or more vortex generators (130) are deployed upstream from the one or more heat sinks (110). Although only a pair of delta winglet vortex generators are shown, it should be understood that this is for illustrative purposes only and is not a limiting feature. In this context, upstream is in relation to an incoming fluid flow, e.g., the cooling fluid flow generated by the one or more cooling fluid flow sources (120). The vortex generators (130) create vortices downstream when in the presence of an incoming fluid flow. This unsteady flow will propagate into the one or more downstream heat sinks (110) thereby enhancing heat transfer.

Figure 2:
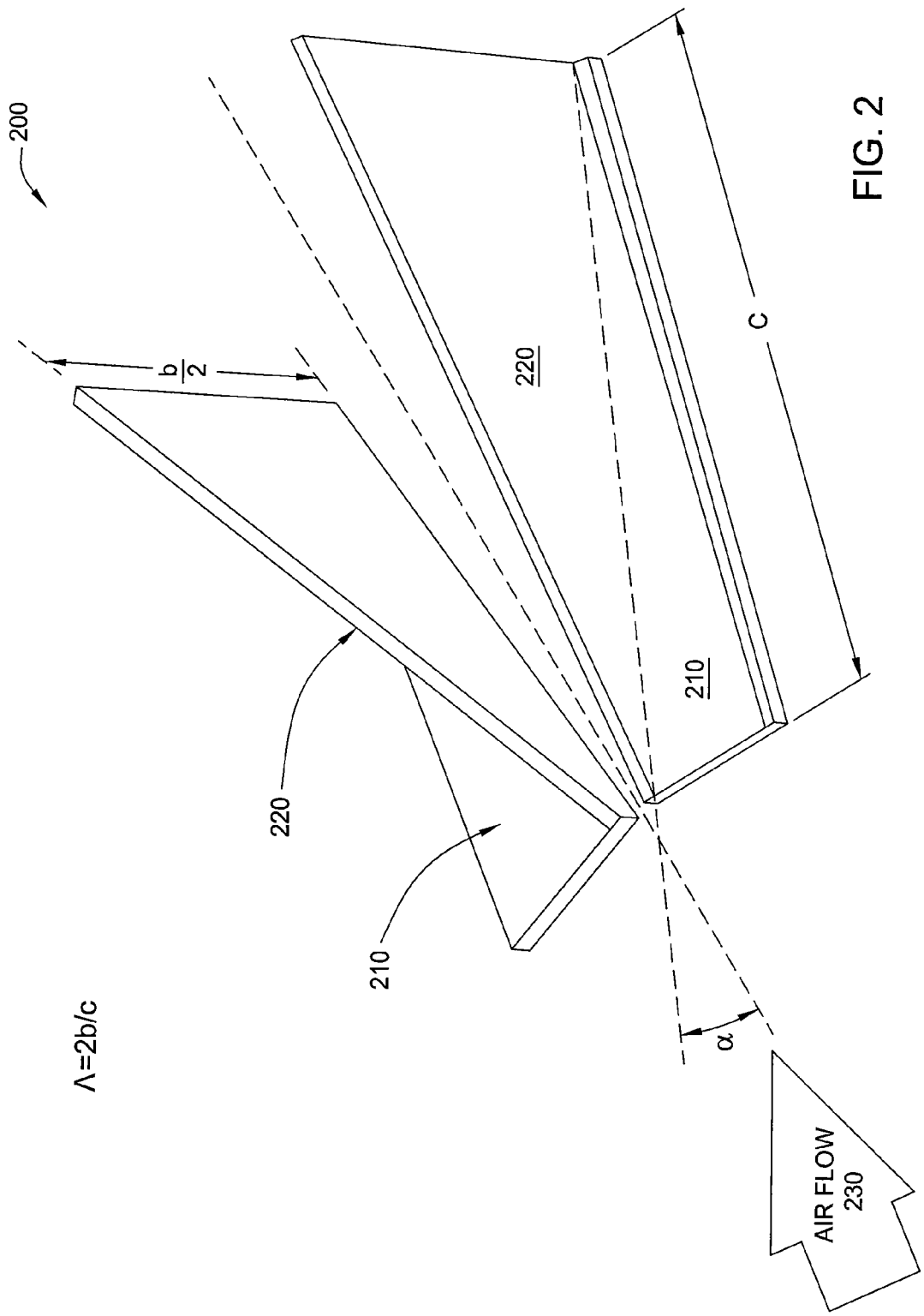
FIG. 2 depicts a perspective view of a pair of delta winglet type vortex generators in accordance with one embodiment.

FIG. 2 illustrates a perspective view of a delta winglet type pair of vortex generators (200), each portion having a base (210) and fin (220). Also depicted in FIG. 2 is the Angle of Attack (AoA), α, and Aspect Ratio, Λ, parameters which will be described in greater detail below. The vortex generators (130) depicted in FIG. 1 may comprise, for example, the delta winglet type pair of vortex generators (200) depicted in FIG. 2. The direction of incoming airflow from one or more cooling fluid flow sources (230) is indicated by the arrow in FIG. 2.

Although the vortex generators (130) and (200) depicted in FIGS. 1 and 2 respectively are shown as a pair of delta winglet type vortex generators, other vortex generator designs may be used within the scope of the embodiments described herein. For example, the vortex generators (130) and (200) may also comprise a rectangular wing or rectangular winglet, delta wing, delta winglet, or other designs. The vortex generators (130) and (200) may also comprise one or many individual vortex generators of any type of vortex generator design.

Figure 3:
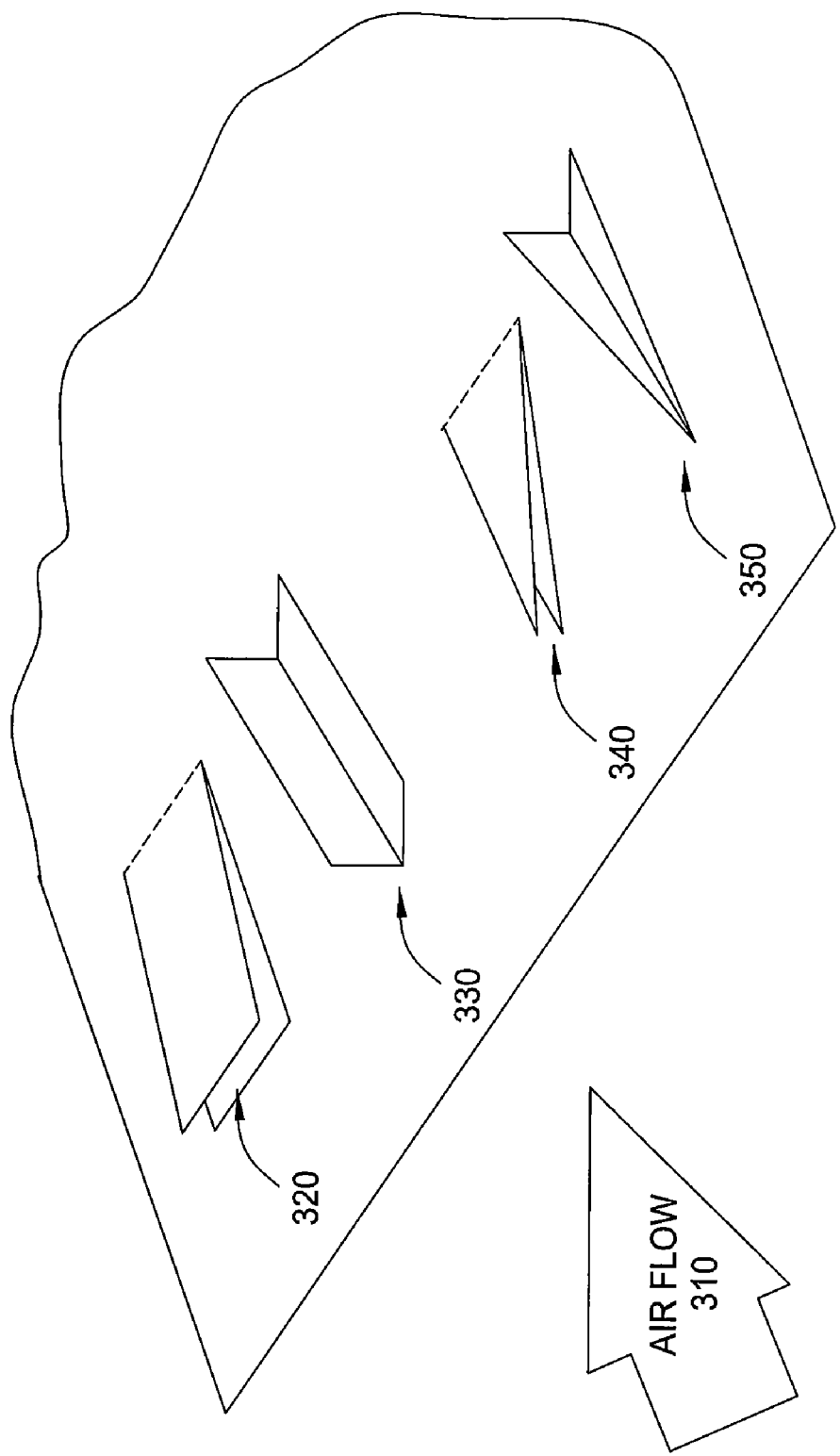
FIG. 3 depicts a perspective view of several types of vortex generators that may be used in accordance with various embodiments.

FIG. 3 illustrates an perspective view of several types of vortex generators shown side-by-side as they would typically be deployed with respect to an incoming flow from one or more cooling fluid flow sources (310). As depicted in FIG. 3, vortex generator (320) is a rectangular wing, vortex generator (330) is a rectangular winglet, vortex generator (340) is a delta wing, and vortex generator (350) is a delta winglet.

Referring back to FIG. 2, some of the parameters used to characterize a vortex generator, such as one of a pair of delta winglet type vortex generators (200), are the Angle of Attack (AoA), α, Aspect Ratio, Λ, and ratio of vortex generator area to heat transfer area. For example, when the AoA increases beyond a certain level (approximately greater than 70° AoA) the vortices shed from the vortex generator may transition from a longitudinal to a transverse state. The inventors note that heat transfer does not significantly increase beyond approximately 65° AoA. Generally, up to the point of transition from longitudinal to transverse vortices, the heat transfer and the pressure drop increase with AoA. It has been shown that longitudinal vortices maintain their coherence over long streamwise distances and for this reason they are believed to exhibit better heat transfer characteristics.

Of course, the ideal dimensions and configuration of a vortex generator or vortex generators may depend on the particular system in which the vortex generator(s) will be deployed. Thus, in particular applications, an AoA of greater than 70° could be ideal. In addition, although longitudinal vortices have been described as having certain advantages, the embodiments of the present invention are not so limited. Rather, it is contemplated that any type of unsteady flow may ideally be generated depending upon the particular application and needs of the system.

Figure 4:
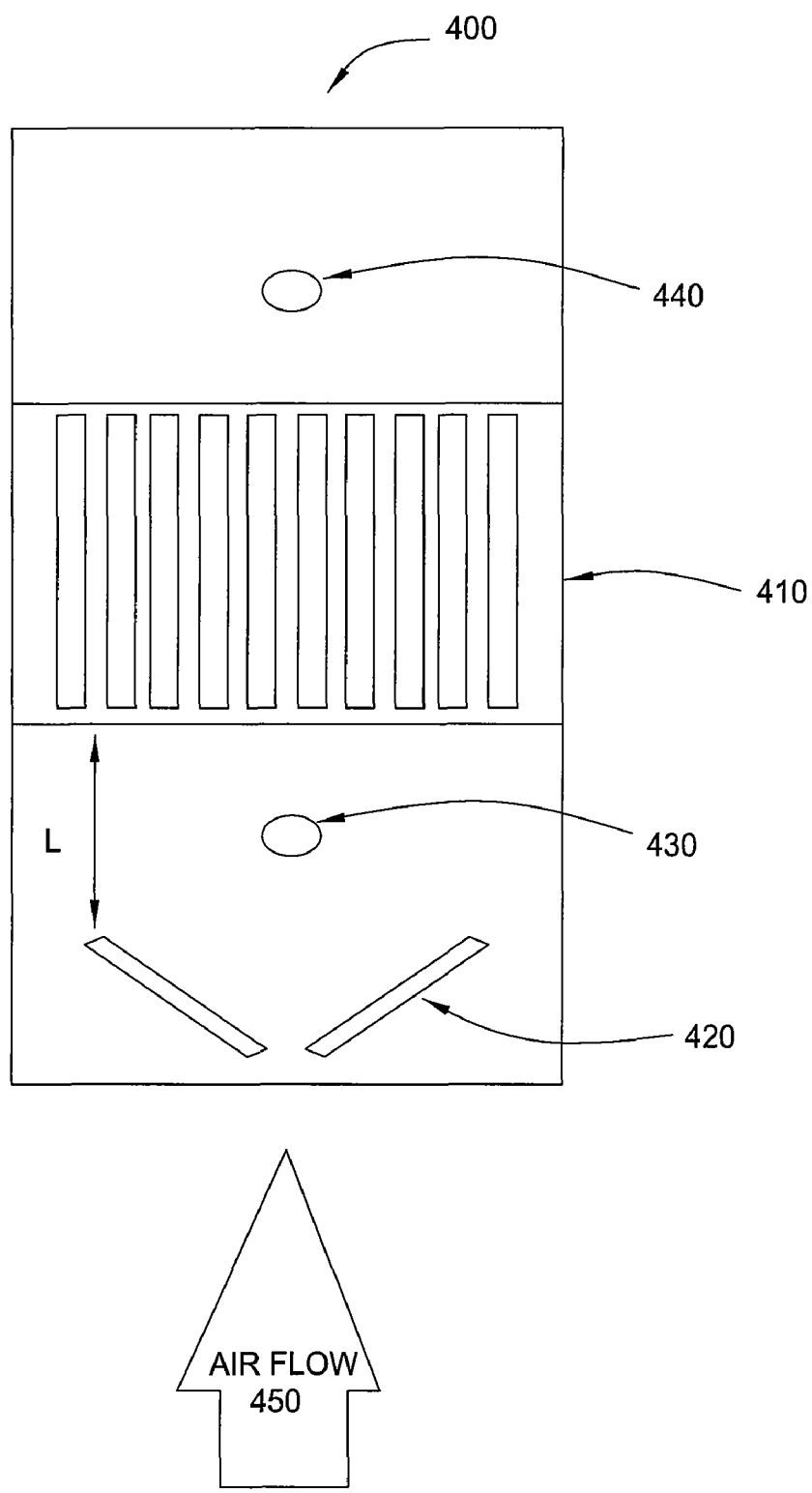
FIG. 4 depicts a top view of a model circuit pack testing apparatus.

FIG. 4 depicts a top-down view of an experimental circuit pack testing apparatus (400), intended to model a circuit pack in accordance with various embodiments. Depicted on the circuit pack testing apparatus (400) of FIG. 4 is a heat sink (410) (shown as a longitudinal fin heat sink), one or more vortex generators (420), which may be a pair of delta winglet type vortex generators as tested (and as shown) or any other suitable type of vortex generator(s), an upstream pressure tap (430) and a downstream pressure tap (440). Incoming airflow from a cooling fluid flow source (450) is indicated by the directional arrow. The distance, L, between the location of the vortex generator(s) (420) and the heat sink (410) on the circuit pack testing apparatus (400) is also indicated in FIG. 4.

In the experimental setup a pair of wall mounted delta winglets (420), illustratively vortex generators with a constant AoA, were used to induce unsteady flow in the incoming airflow from the cooling fluid flow source (450) upstream of a longitudinally finned heat sink (410) in a fully ducted developing flow to evaluate the efficacy of using vortex generators for enhanced heat transfer in similar configurations. An approximately 10% reduction in thermal resistance of the heat sink (410) was achieved at a constant pressure drop across the heat sink (410) when the fins of the vortex generators (420) occupied the entire height of the duct. In addition, results indicate that the largest reduction in the thermal resistance of the heat sink (410) is achieved when the vortex generators (420) are placed close to the heat sink (430). This may be due to the fact that when the vortex generators (420) are placed close to the heat sink (410), the vortex strength is large compared to the vortex strength when the vortex generators (420) are placed farther upstream. Streamwise pressure drop penalties (in the direction of fluid flow) across the heat sink due to the introduction of vortex generators were found to be tolerable in view of the significant reductions in thermal resistance of the heat sink that may be achieved.

Figure 5:
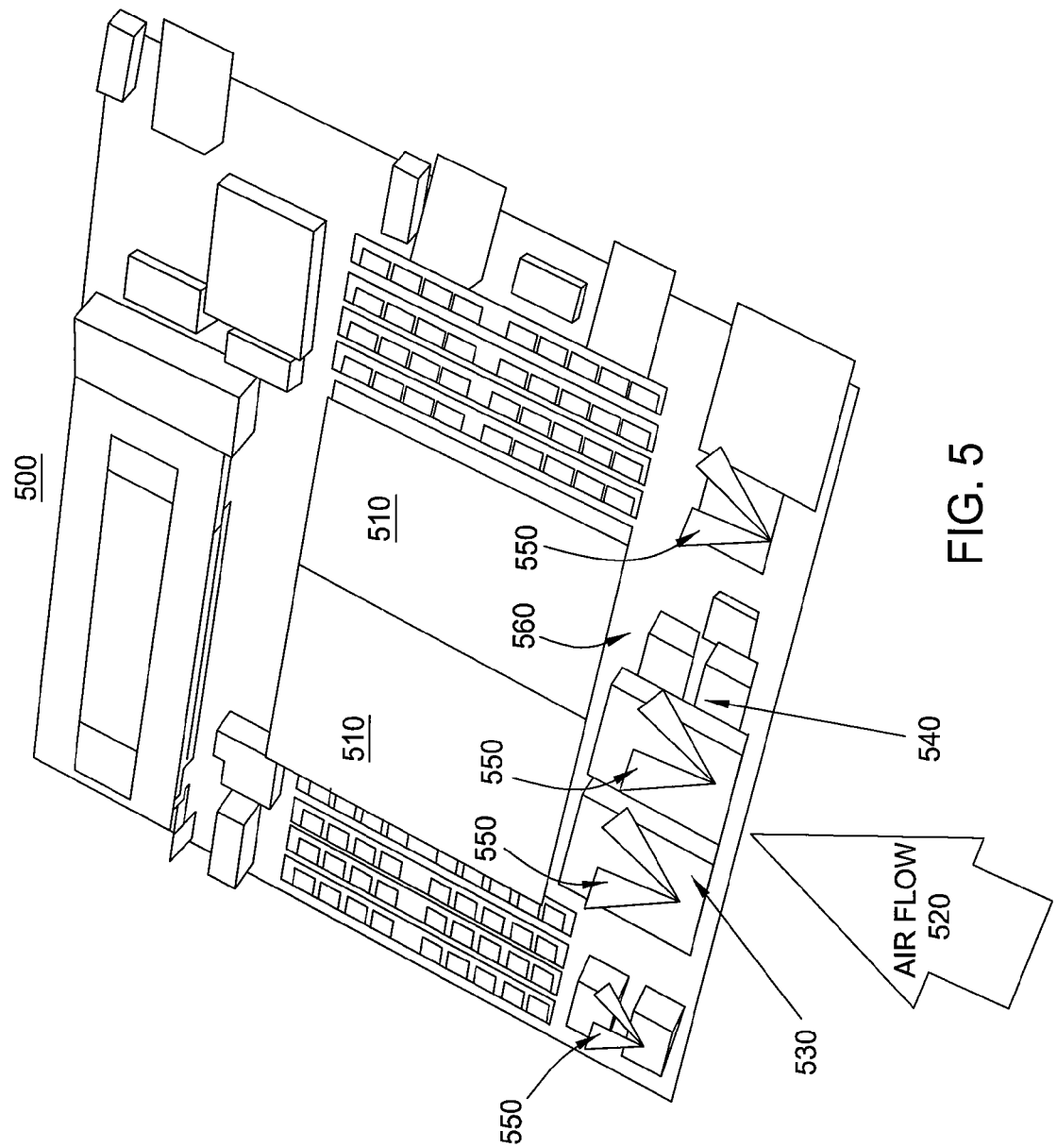
FIG. 5 depicts a representation of an exemplary circuit pack with a plurality of vortex generators deployed in accordance with one embodiment.

FIG. 5 illustrates a representation of a circuit pack (500), such as a remote network controller circuit pack, in accordance with one embodiment. As shown in FIG. 5, upstream of the heat sinks (510) in relation to an incoming cooling fluid flow (e.g., airflow or any other suitable type of cooling fluid flow) (520) are power converters (530) and capacitors (540). Placing these components upstream of the heat sinks (510) degrades the heat transfer capability of the heat sinks (510) since the power converters (530) and capacitors (540) block the incoming cooling fluid flow (520) properly entering the heat sinks (510). However, there is available space above the capacitors (540) and power converters (530) that is not utilized upstream of the two heat sinks (510).

It is shown in FIG. 5 that vortex generators (550) may be placed in the circuit pack (500) on top of these components upstream of the heat sinks (510). When the incoming cooling fluid flow (520) passes over the power converters (530), vortices will be generated downstream of the vortex generators (550). This unsteady flow will propagate into the heat sink (510), thereby enhancing heat transfer. The vortex generators (550) may be very small and light weight plastic parts that cost very little and can be placed in many places on the circuit pack (500) in accordance with the above and other embodiments described herein. Although the vortex generator(s) of one embodiment are described as being formed of plastic, it should be understood that the vortex generators may be fabricated from any number of other natural or man-made materials in accordance with various embodiments. In addition, although the vortex generators (550) are depicted as winglet type vortex generators, additional types of vortex generators, such as those shown in FIG. 3, may be used in accordance with various embodiments. Additional features of a typical circuit pack (not labeled) are also depicted in FIG. 5 for illustrative purposes.

The placement of the vortex generators (550) above the power converters (530) and capacitors (540) will also enhance the heat transfer in another way. The vortices being shed from the vortex generators (550) have highly mixed flow. This high degree of mixing will reduce the size of the flow separation zone (560) located downstream of the power converters (530) and capacitors (540). Flow separation zones are undesirable for two reasons. First, they increase the pressure drop in a system. Second, re-circulating areas of flow are trapped in the separation zone. This can lead to increased heating due to the stagnate nature of the flow.

FIG. 6 illustrates a side-on view of features of a model circuit pack (600) with power converter (610) and at least one heat sink (620), without attached vortex generators upstream of the at least one heat sink (620). The direction of incoming airflow is indicated by the arrow from cooling fluid flow source (630). As can be seen, a large flow separation zone (640) having relatively stagnate hot fluid forms in the zone between the power converter (610) and the at least one heat sink (620).

FIG. 7 illustrates a side-on view of features of a model circuit pack (700) with power converter (710) and at least one heat sink (720), with one or more attached vortex generator(s) (750) upstream of the at least one heat sink (720). The direction of incoming airflow is indicated by the arrow from cooling fluid flow source (730). The vortex (760) created by the vortex generator(s) (750) in the presence of the incoming airflow is also shown in FIG. 7. Although the vortex (760) depicted in FIG. 7 is illustrated as a coherent spiral vortex, it should be understood that the induced vortex may be selected as a spiral type of flow with varying levels of coherence or steadiness. By way of non-limiting example, the induced vortex (760) may comprise laminar, transitional or turbulent flow. A flow separation zone (740) much reduced in size (in comparison to flow separation zone (640) of FIG. 6) is achieved by placing vortex generators(s) (750) on the circuit pack (700) with the upstream components such as power converter (710).

As shown and described above, the introduction of optimally designed vortex generators placed on the circuit pack may enhance heat transfer by generating unsteady cooling fluid flow, and achieve reductions in the thermal resistance of the heat sinks greater than 10% compared to existing forced convection airflow systems. In this context, thermal resistance of the heat sink is defined as the difference between the heat sink temperature and the ambient air temperature divided by the input power. By placing the vortex generators on the circuit pack upstream of high power dissipation devices, the heat transfer is improved considerably, thereby reducing the heat sink thermal resistance for little extra cost and without large pressure drop penalties. Specifically, vortex generators create unsteady flow that enhances heat transfer by increasing the mixing in a fluid stream and thinning the boundary layers to which the vortices come into contact.

One advantage of using vortex generators in accordance with embodiments described herein is that the vortex generators can be placed in many places on a circuit pack design. In the typical circuit pack design there are regions of airflow that are underutilized for enhanced cooling. For example, in most circuit packs, such as those typically used in telecommunications applications or blade designs (such as are used in datacom equipment), there is free space allowed for incoming air flow/cooling fluid flow. In accordance with various embodiments, vortex generators may be placed in these or other underutilized regions to enhance heat transfer and provide better cooling to the most power hungry components. Thus, free space on a circuit pack that has previously not been use for enhanced air cooling is made productive.

Another advantage of the use of vortex generators for circuit pack cooling in accordance with the discussed embodiments is that they are inexpensive, small and have practically no weight, thus contributing little to the overall weight of the system. In one embodiment, vortex generators can be manufactured using light plastics which add little weight to the overall design and they can be placed in many locations on the circuit board. Because the vortex generators can be manufactured from plastic they are a low cost solution to many thermal problems faced in various fields such as telecommunications and electronics.

In this context a vortex generator may include any geometry that is purposefully designed to generate unsteady flow in the presence of an incoming fluid flow to improve heat transfer. Numerous types of vortex generators are known in the art, such as the rectangular wing, rectangular winglet, delta wing and delta winglet. A vortex generator in accordance with various embodiments may include additional shapes, such as cylindrical, cuboids or any other suitable shapes. In addition, it is to be understood that any new and additional geometries of a vortex generator that may be developed may also be used within the scope of the embodiments discussed and claimed herein.

By way of the above described embodiments, one can enhance the heat transfer over the whole board considerably at very low cost. The use of vortex generators as described in this application could become an enabling technology for remote network controller boards and optical transport circuit packs to meet the thermal and acoustic requirements of NEBS and ETSI. The above described embodiments may improve thermal margins and may also become a product enabling technology for some applications. In addition, vortex generators may also be used in other electronics cooling applications, such as desktop and notebook computers and other applications, in accordance with the described embodiments.

In one embodiment, an apparatus is provided having at least one heat sink, which may include a plurality of cooling fins for cooling at least one heat generating component, and at least one vortex generator. The vortex generator(s) may be positioned upstream from the at least one heat sink in relation to a cooling fluid flow such that at least one vortex having an unsteady flow is imparted to the cooling fluid flow proximate the surfaces of the plurality of cooling fins in order to reduce the thermal resistance of the at least one heat sink.

In another embodiment, a method is provided including the steps of, disposing at least one heat sink including a plurality of cooling fins in thermal communication with at least one heat generating component of a circuit pack, providing at least one source for a cooling fluid flow directed towards the at least one heat sink, and disposing at least one vortex generator on the circuit pack upstream of the at least one heat sink such that at least one vortex having an unsteady flow is imparted to the cooling fluid flow proximate the surfaces of the plurality of cooling fins of the at least one heat sink in order to reduce thereby the thermal resistance of the at least one heat sink.

Another embodiment provides a system having a circuit pack with at least one heat generating component, at least one heat sink which may include a plurality of cooling fins in thermal communication with the heat generating component, at least one source for directing a cooling fluid flow towards the at least one heat sink, and at least one vortex generator disposed on the circuit pack upstream of the at least one heat sink such that at least one vortex having an unsteady flow is imparted to the cooling fluid flow proximate the surfaces of the plurality of cooling fins of the at least one heat sink in order to reduce the thermal resistance of the at least one heat sink. In one embodiment, the circuit pack may include at least one additional component upstream of the at least one heat sink in relation to the cooling fluid flow. The vortex generator(s) may be positioned to manipulate the cooling fluid flow presented to the at least one heat sink such that a boundary layer between the additional component and the surfaces of the plurality of cooling fins of the at least one heat sink is thinned for enhanced heat transfer.

It should be noted that the above description merely provides a disclosure of particular embodiments of the invention and is not intended for the purposes of limiting the same thereto. As such, the invention is not limited to only the above-described embodiments. Rather, it is recognized that one skilled in the art could conceive alternative embodiments that fall within the scope of the invention.

What is claimed is:

1. An apparatus, comprising:
   at least one heat sink including a plurality of cooling fins for cooling at least one heat generating component; and
   at least one delta winglet type vortex generator having a corresponding angle of attack (AoA) and aspect ratio, positioned upstream of said at least one heat sink in relation to a cooling fluid flow presented to said at least one heat sink such that at least one vortex proportionate to said angle of attack and aspect ratio, imparts an unsteady flow to the cooling fluid flow proximate the surfaces of said plurality of cooling fins of said at least one heat sink to reduce thereby the thermal resistance of said at least one heat sink.

2. The apparatus of claim 1, further comprising:
   at least one additional vortex generator positioned to manipulate the cooling fluid flow presented to said at least one heat sink such that at least one additional vortex having an unsteady flow is imparted to the cooling fluid flow proximate the surfaces of said plurality of cooling fins of said at least one heat sink to reduce thereby the thermal resistance of said at least one heat sink.

3. The apparatus of claim 1, further comprising:
   a circuit pack including said at least one heat sink, said at least one heat generating component and said at least one vortex generator, having at least one additional component upstream of said at least one heat sink in relation to the cooling fluid flow, wherein said at least one vortex generator is positioned to manipulate the cooling fluid flow presented to said at least one heat sink such that a boundary layer between said at least one additional component and the surfaces of said plurality of cooling fins is thinned.

4. The apparatus of claim 3, further comprising:
   at least one additional vortex generator positioned to manipulate the cooling fluid flow presented to said at least one heat sink such that a boundary layer between said at least one additional component and the surfaces of said plurality of cooling fins is thinned.

5. The apparatus of claim 1, wherein said plurality of cooling fins comprise longitudinal fins.

6. The apparatus of claim 1, wherein said at least one vortex generator is positioned to impart a vortex having laminar or turbulent flow to the cooling fluid flow.

7. A method, comprising:
   disposing at least one heat sink including a plurality of cooling fins in thermal communication with at least one heat generating component of a circuit pack;
   providing at least one source for a cooling fluid flow directed towards said at least one heat sink; and
   disposing at least one delta winglet type vortex generator having a corresponding angle of attack (AoA) and aspect ratio on said circuit pack upstream of said at least one heat sink in relation to the cooling fluid flow presented to said at least one heat sink such that at least one vortex proportionate to said angle of attack and aspect ratio, imparts an unsteady flow to the cooling fluid flow proximate the surfaces of said plurality of cooling fins of said at least one heat sink to reduce thereby the thermal resistance of said at least one heat sink.

8. The method of claim 7, further comprising:
   disposing at least one additional vortex generator on the circuit pack positioned to manipulate the cooling fluid flow presented to said at least one heat sink such that at least one additional vortex having an unsteady flow is imparted to the cooling fluid flow proximate the surfaces of said plurality of cooling fins of said at least one heat sink to reduce thereby the thermal resistance of said at least one heat sink.

9. The method of claim 7, further comprising:
   positioning said at least one vortex generator to impart a vortex having laminar, transitional or turbulent flow to the cooling fluid flow.

10. The method of claim 7, further comprising:
positioning said at least one vortex generator to manipulate the cooling fluid flow presented to said at least one heat sink such that a boundary layer between at least one additional component upstream of said at least one heat sink in relation to the cooling fluid flow and the surfaces of said plurality of cooling fins is thinned for enhanced heat transfer.

11. The method of claim 10, further comprising:
positioning at least one additional vortex generator to manipulate the cooling fluid flow presented to said at least one heat sink such that a boundary layer between said at least one additional component and the surfaces of said plurality of cooling fins is thinned.

12. The method of claim 7, further comprising:
selecting an angle of attack and dimensions of said at least one vortex generator to minimize thermal resistance of said at least one heat sink.

13. A system, comprising:
a circuit pack having at least one heat generating component;
at least one heat sink including a plurality of cooling fins in thermal communication with said at least one heat generating component;
at least one cooling fluid flow directed towards said at least one heat sink; and
at least one delta winglet type vortex generator having a corresponding angle of attack (AoA) and aspect ratio, disposed on said circuit pack upstream of said at least one heat sink in relation to the cooling fluid flow directed towards said at least one heat sink such that at least one vortex proportionate to said angle of attack and aspect ratio, imparts an unsteady flow to the cooling fluid flow proximate the surfaces of said plurality of cooling fins of said at least one heat sink to reduce thereby the thermal resistance of said at least one heat sink.

14. The system of claim 13, wherein said at least one vortex generator is positioned to manipulate the cooling fluid flow directed towards said at least one heat sink such that a boundary layer between at least one additional component on the circuit pack upstream of said at least one heat sink in relation to the cooling fluid flow and the surfaces of said plurality of cooling fins is thinned.

15. The system of claim 13, wherein said at least one vortex generator is positioned on said circuit pack as close as possible to said at least one heat sink upstream from said heat sink in relation to said cooling fluid flow.

* * * * *